Figure 1:
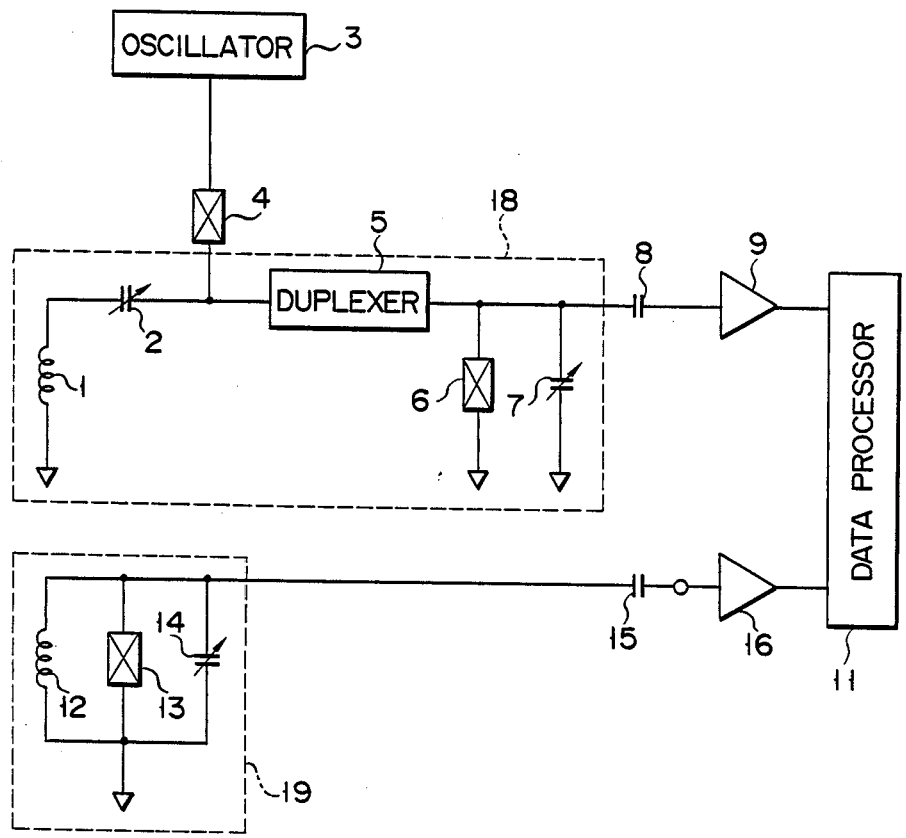
Figure 3:
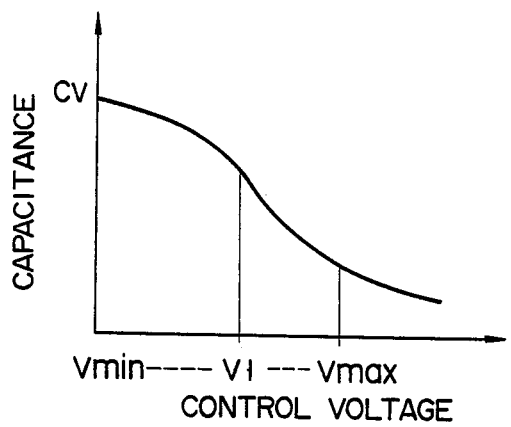
Figure 4:
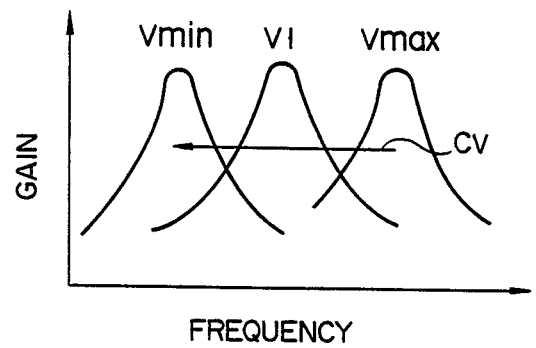

United States Patent [19]

Sugiura

[11] Patent Number: 4,839,596
[45] Date of Patent: Jun. 13, 1989

[54] TRANSMITTING/RECEIVING SYSTEM FOR MAGNETIC RESONANCE IMAGING SYSTEM

[75] Inventor: Satoshi Sugiura, Redwood City, Calif.

[73] Assignee: Kabushiki Kaisha Toshiba, Kawasaki, Japan

[21] Appl. No.: 135,177

[22] Filed: Dec. 18, 1987

[30] Foreign Application Priority Data

Dec. 19, 1986 [JP] Japan .................. 61-301366

[51] Int. Cl.$^4$ .................................. G01R 33/20
[52] U.S. Cl. .................................. 324/322; 324/307
[58] Field of Search ............ 324/307, 309, 311, 312, 324/318, 322

[56] References Cited

U.S. PATENT DOCUMENTS

| | | | |
|---|---|---|---|
| 4,602,213 | 7/1986 | Sugiura | 324/313 |
| 4,652,827 | 3/1987 | Eguchi et al. | 324/312 |
| 4,682,112 | 7/1987 | Beer | 324/312 |
| 4,717,881 | 1/1988 | Flugan | 324/318 |

Primary Examiner—Stewart J. Levy
Assistant Examiner—Kevin D. O'Shea
Attorney, Agent, or Firm—Foley & Lardner, Schwartz, Jeffery, Schwaab, Mack, Blumenthal & Evans

[57] ABSTRACT

A transmitting/receiving system for use in a magnetic resonance imaging system includes a first coil section used for both transmission and reception, a transmitter for transmitting a high-frequency field for exciting a magnetic resonance phenomenon to an object through the first coil section, a first receiver which constitutes a first resonator, capable of resonating with a magnetic resonance signal from the object, together with the first coil section, for receiving the magnetic resonance signal through the first coil section, a second coil section used for reception, and a second receiver which constitutes a second resonator, capable of resonating with the magnetic resonance signal from the object, together with the second coil section, for receiving the magnetic resonance signal through the second coil section. Either the first or second receiver is selectively used. When the second receiver is enabled, a resonance condition of the first resonator is changed to suppress resonance of the first resonator with respect to the magnetic resonance signal.

5 Claims, 6 Drawing Sheets

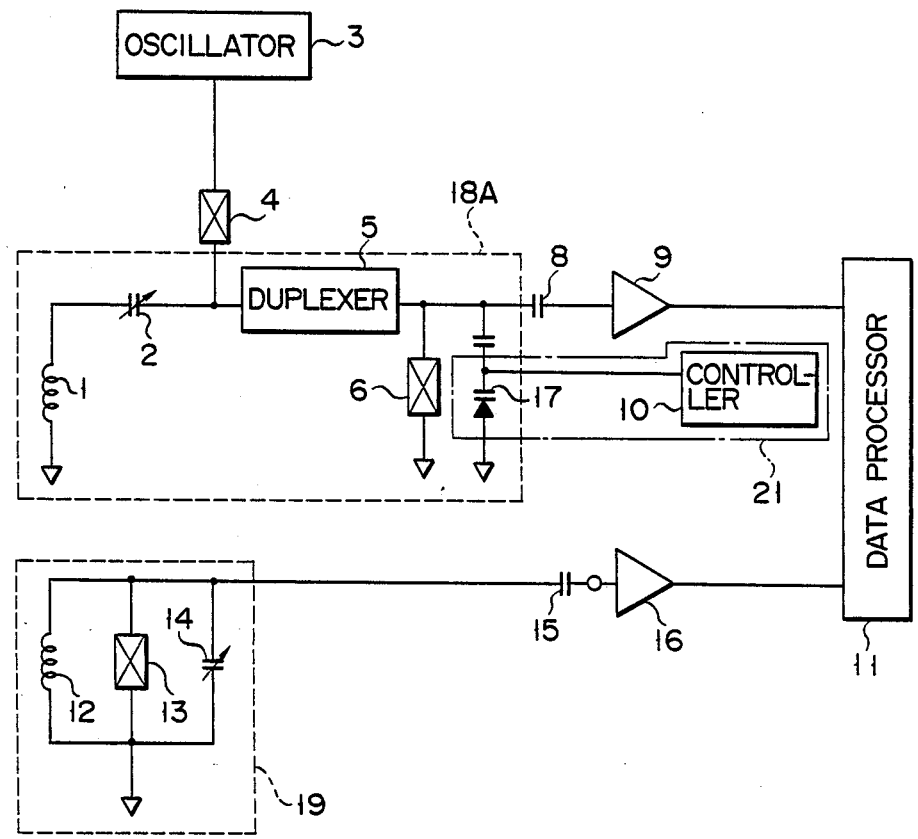
F I G. 2

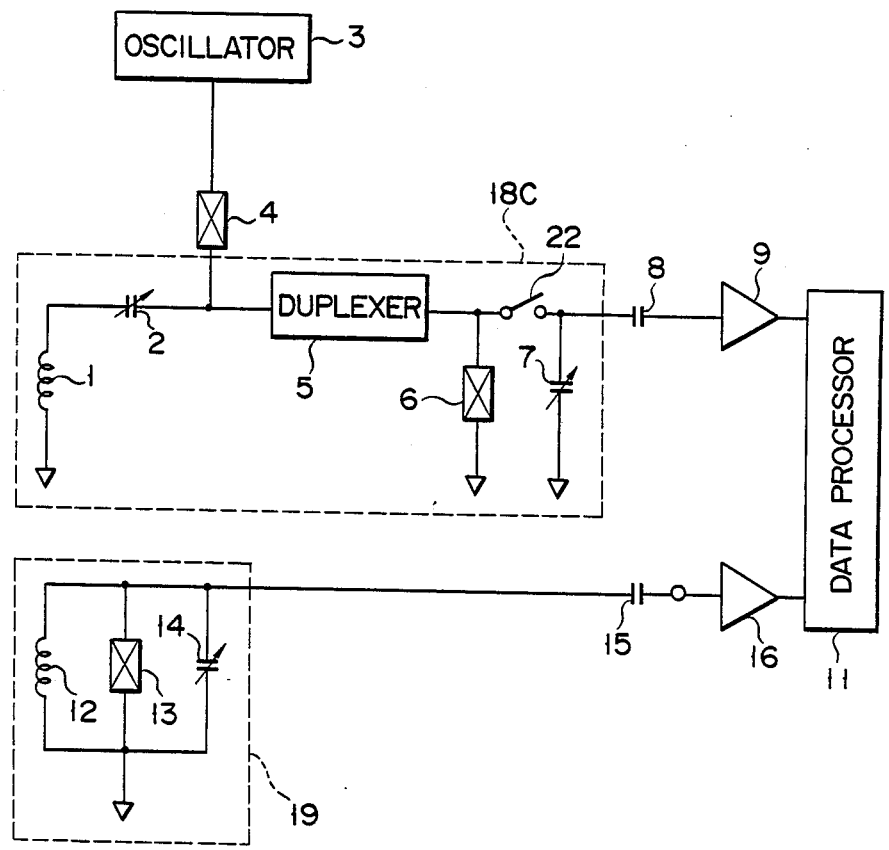
F I G. 6

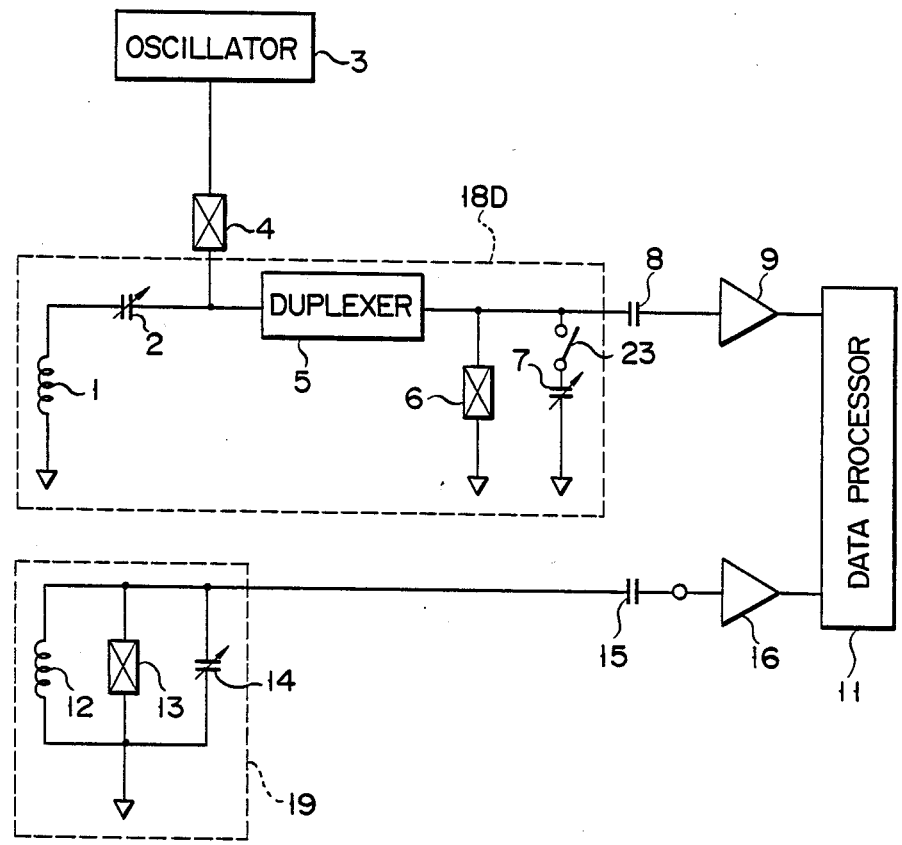
F I G. 7

TRANSMITTING/RECEIVING SYSTEM FOR MAGNETIC RESONANCE IMAGING SYSTEM

BACKGROUND OF THE INVENTION

The present invention relates to a transmitting-/receiving system used for transmitting a high-frequency field to excite a magnetic resonance (MR) phenomenon and receiving and detecting an MR signal produced by the MR phenomenon in a magnetic resonance imaging (MRI) system for exciting the MR phenomenon in an object and for obtaining MR information in the object.

In an MRI system, a uniform static field is applied to a desired portion of an object, and a transmitting RF coil for forming a high-frequency field, i.e., an RF (radio frequency) field in a direction perpendicular to the static field is used. Thus, an MR phenomenon is caused in a specific slice from which a tomographic image is to be obtained. Then, MR signals generated from atomic nuclei after the RF field is removed are detected using a receiving RF coil. Upon excitation of the MR phenomenon and acquisition of the MR signals, in order to select a specific slice and/or to provide position information to MR signals, a gradient field is applied to the object, as needed.

FIG. 1 shows an arrangement of a conventional transmitting/receiving system in the MRI system.

A transmitting system comprises transmitting/receiving coil 1, variable capacitor 2, RF pulse oscillator 3, and cross diode switch 4. A receiving system comprises capacitors 8 and 15, preamplifiers 9 and 16, and first and second receivers 18 and 19.

Cross diode switch 4 has a basic arrangement in which two diodes are cross-coupled. Cross diode switch 4 serves as a high-frequency switch for passing a signal having an amplitude larger than a predetermined value and cutting off a signal having a smaller amplitude. RF pulses from oscillator 3 are applied to transmitting/receiving coil 1 through cross diode switch 4, and the RF pulses are transmitted from transmitting-/receiving coil 1 to an object.

MR signals from the object are received through first or second receiver 18 or 19.

First receiver 18 has transmitting/receiving coil 1, variable capacitors 2 and 7, duplexer 5, and cross diode switch 6. Variable capacitor 7 is adopted for tuning, and is used for adjustment for tuning first receiver 18 with the MR signals from the object. Transmitting/receiving coil 1 is used for both transmission and reception, and normally comprises a saddle coil. Duplexer 5 is provided as needed, and is used for switching transmitting and receiving modes together with cross diode switches 4 and 6. Duplexer 5 is constituted by, e.g., a λ/4 cable or coil. First receiver 18 is used for receiving MR signals in a whole body (WB) imaging mode.

Second receiver 19 is constituted by receiving coil 12, cross diode switch 13, and variable capacitor 14 which are connected in parallel with each other. Variable capacitor 14 is used for adjustment for tuning second receiver 18 with the MR signals from the object. As receiving coil 18, a small coil having a good filling factor for obtaining a higher S/N ratio than that of transmitting/receiving coil 1 is adopted. Second receiver 19 is often used for receiving MR signals in a head portion imaging mode. A surface coil used for receiving MR signals in a local imaging mode for locally imaging a portion near a body surface belongs to receiving coil 12.

In the above arrangement, in the WB imaging mode, RF pulses are transmitted through transmitting/receiving coil 1, thus causing the MR phenomenon in an object. MR signals generated by the MR phenomenon are amplified by preamplifier 9, and are then processed by data processor 11. A method wherein excitation of the MR phenomenon and reception of MR signals are performed using only transmitting/receiving coil 1 is called a single coil method.

In the head portion (brain) imaging mode, RF pulses are transmitted through transmitting/receiving coil 1 to excite the MR phenomenon in the same manner as in the single coil method. In this case, MR signals are received through second receiver 19, and the reception signals are amplified by preamplifier 16. Thereafter, the signals are processed by data processor 11. In this manner, a method wherein transmission of the high-frequency field and reception of the MR signals are respectively performed by transmitting coil 1 and receiving coil 12 is called a cross coil method.

However, first and second receivers 18 and 19 are designed and adjusted to resonate, i.e., tuned with the MR signals in order to efficiently receive the MR signals from the object. When MR signals are received by first receiver 18, receiving coil 12 is unnecessary, and second receiver 19 including coil 12 is disabled. When MR signals are received through second receiver 19, transmitting/receiving coil 1 is necessary for transmitting a high-frequency field, and it cannot be disabled. In this case, since first receiver 18 is also adjusted to be tuned and resonate at a frequency of the MR signals, an inductive electromotive force to be induced in only receiving coil 12 is also partially induced in transmitting/receiving coil 1. As a result, a reception level of MR signals of second receiver 19 is decreased. A decrease in reception level of MR signals causes degradation in image quality of an MR image to be formed.

SUMMARY OF THE INVENTION

It is an object of the present invention to provide a transmitting/receiving system capable of increasing a reception level of MR signals of a receiver including a receiving coil in an MRI system which can selectively use both a single coil method and a cross coil method.

A transmitting/receiving system according to the present invention comprises a first high-frequency coil section used for both transmission and reception, a transmitter for transmitting a high-frequency field for exciting an MR phenomenon to an object through the first high-frequency coil section, a first receiver which constitutes a first resonator, capable of resonating with an MR signal from the object, together with the first high-frequency coil section, for receiving the MR signal through the first high-frequency coil section, a second high-frequency coil section used for only reception, and a second receiver which constitutes a second resonator, capable of resonating with the MR signal from the object, together with the second high-frequency coil section, for receiving the MR signal through the second high-frequency coil section. The transmitting/receiving system further comprises a resonance controller for, when the second receiver is valid, changing a resonance condition of the first resonator to suppress resonance of the first resonator with respect to the MR signal from the object.

second receiver means which constitutes a second resonator, capable of resonating with the magnetic resonance signal from the object, together with said second high-frequency coil means, for receiving the magnetic resonance signal through said second high-frequency coil means;

selection means for selectively enabling one of said first and second receiver means; and resonance control means, operated in accordance with selection of said selection means, for, when said second receiver means is enabled, changing a resonance condition of said first resonator so as to suppress resonance of said first resonator with respect to the magnetic resonance signal from the object.

2. A system according to claim 1, wherein said resonance control means includes variable capacitance means provided to said first resonator, and capacitance control means for controlling a capacitance of said variable capacitance means.

3. A system according to claim 2, wherein said variable capacitance means comprises a variable capacitance diode.

4. A system according to claim 2, wherein said variable capacitance means includes capacitance means provided to said first resonator, and switch means for disabling at least a part of said capacitance means from said first resonator.

5. A system according to claim 1, wherein said resonance control means includes switch means for cutting off part of said first resonator.

* * * * *

United States Patent [19]

Mower et al.

[11] Patent Number: 4,839,603

[45] Date of Patent: Jun. 13, 1989

[54] MULTIPLE-LOOP MICROWAVE FREQUENCY SYNTHESIZER USING TWO PHASE LOCKLOOPS

[75] Inventors: Vaughn L. Mower, Bountiful; Evan A. Deneris, Salt Lake City; John B. Cox, West Bountiful, all of Utah

[73] Assignee: Unisys Corporation, Blue Bell, Pa.

[21] Appl. No.: 100,400

[22] Filed: Sep. 24, 1987

[51] Int. Cl.[4] .................. H03B 19/00; H03L 7/00
[52] U.S. Cl. ................................ 328/14; 328/15; 331/2; 331/22
[58] Field of Search ............ 328/14, 15, 16, 17; 331/2, 22, 19

[56] References Cited

U.S. PATENT DOCUMENTS

| | | | |
|---|---|---|---|
| 4,528,522 | 7/1985 | Matsuura | 331/2 |
| 4,551,689 | 11/1985 | Scala et al. | 331/2 |
| 4,602,225 | 7/1986 | Miller et al. | 331/2 |
| 4,603,304 | 7/1986 | Burns et al. | 331/2 |
| 4,720,688 | 1/1988 | Haegawa et al. | 331/2 |

Primary Examiner—Stanley D. Miller
Assistant Examiner—Richard Roseen
Attorney, Agent, or Firm—John B. Sowell; Mark T. Starr; Thomas J. Scott

[57] ABSTRACT

A multiple-loop microwave frequency synthesizer is provided with an upper and a lower phased-lock loop. The phased-lock loops are mutually connected to a novel sampling mixer and their outputs are connected to an up-converter for providing microwave frequency generated signals. The phased-lock loops are provided with a plurality of programmable frequency dividers connected to a processor controller to provide a wide range of adjustable frequencies up to 20 gigahertz at the output of the frequency synthesizer.

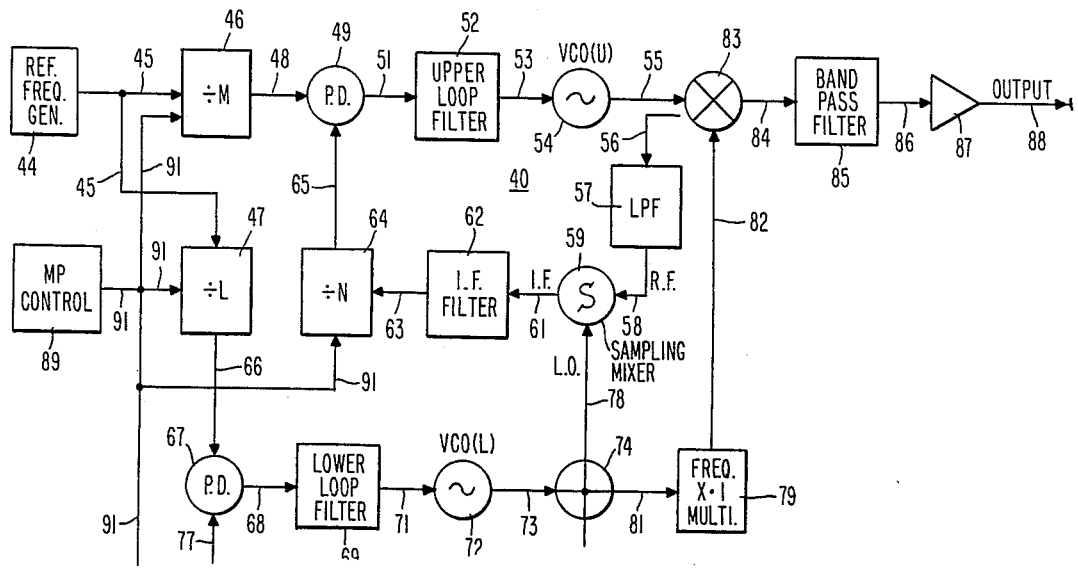

12 Claims, 3 Drawing Sheets